United States Patent [19]

Schachameyer

[11] 4,428,986
[45] Jan. 31, 1984

[54] METHOD OF PREPARING A BERYLLIA SUBSTRATE FOR SUBSEQUENT AUTOCATALYTIC DEPOSITION OF A METALLIZED FILM DIRECTLY THEREON

[75] Inventor: Steven R. Schachameyer, Whitefish Bay, Wis.

[73] Assignee: Eaton Corporation, Cleveland, Ohio

[21] Appl. No.: 442,556

[22] Filed: Nov. 18, 1982

[51] Int. Cl.$^3$ ............................................... B05D 3/04
[52] U.S. Cl. ................................... 427/309; 156/651; 156/663; 156/667; 252/79.3; 252/79.5; 427/430.1; 427/443.2
[58] Field of Search ........................... 252/79.3, 79.5; 156/651, 663, 667; 427/309, 430 A, 430 B, 444, 430.1, 443.2; 134/2, 3; 65/31

[56] References Cited

U.S. PATENT DOCUMENTS

| | | | |
|---|---|---|---|
| 3,296,012 | 1/1937 | Statnecker | 427/309 X |
| 3,690,921 | 9/1972 | Elmore | 427/299 |
| 4,135,012 | 1/1979 | Su | 427/309 |

Primary Examiner—William A. Powell
Attorney, Agent, or Firm—C. H. Grace; L. G. Vande Zande

[57] ABSTRACT

Beryllia is prepared for direct autocatalytic plating of a metal film by immersing it first in a sodium hydroxide solution for roughening the surface uniformly, rinsing it in water, then immersing it in a fluoride-based solution for etching silica and magnesium from the grain boundaries, rinsing it in water and then plating the beryllia by conventional methods for metallizing non-conductors.

14 Claims, No Drawings

METHOD OF PREPARING A BERYLLIA SUBSTRATE FOR SUBSEQUENT AUTOCATALYTIC DEPOSITION OF A METALLIZED FILM DIRECTLY THEREON

BACKGROUND OF THE INVENTION

This invention relates to methods of metallizing beryllia substrates to enable soldered connections to be made to the metallized film. In particular, this invention relates to an improved method of metallizing beryllia substrates through direct autocatalytic deposition of a metallized film thereon which provides a strong mechanical bond between the substrate and film.

In the manufacture and use of semiconductors it is occasionally necessary or desirable to mount a semiconductor on a dielectric for electrical isolation of the semiconductor chip. Ceramics are preferable dielectrics for this purpose because they also possess good thermoconductivity properties useful in removing heat from the semiconductor when in operation. Beryllia (beryllium oxide) has the highest thermoconductivity of all ceramics and is therefore preferred in applications where good heat dissipation is a significant criteria. However, beryllia is also one of the most expensive ceramics.

Semiconductors are conventionally mounted to the ceramic substrates by soldering, thereby requiring that the substrate by provided with a metallized film for obtaining a solderable surface. Presently known methods for metallizing beryllia exist in the vacuum technologies such as plasma spraying, ion plating and sputtering. A more conventional method involves firing another ceramic, moly-manganese, to the beryllia as an intermediate substrate which is then platable by autocatalytic deposition plating processes to achieve the metallized film surface. These methods each involve capital and operational expense which adds to the high cost of the beryllia substrate.

The economic burdens associated with the use of beryllia as a semiconductor mounting substrate can be significantly reduced by directly plating the substrate by conventional autocatalytic deposition methods. Attempts to accomplish this have, however, provided unsatisfactory bonds between the substrate and the metallized film which in turn provide an inadequate mechanical bond of the semiconductor to the substrate. The invention disclosed herein primarily resides in the discovery of the particular properties of a beryllia substrate which contribute to the aforementioned unsatisfactory bonds and in recognizing a manner in which to operate upon these properties to render the beryllia substrate fully suitable for metallization by direct autocatalytic deposition.

Beryllia substrates are available in various grades determined by the contents of the beryllia in proportion to other materials present in the substrate. The thermoconductivity properties of the substrate decrease as the content of other materials increases. Thus, for applications of beryllia substrate as a semiconductor mount having good thermoconductivity, it is preferable to use a wafer type substrate wherein the beryllia content is very high. This material is manufactured in at least one commercially available embodiment by forming a slurry of beryllia with silica and magnesium, spreading this slurry in the desired thickness on a film sheet such as mylar, allowing this slurry to harden, fusing the material under high temperatures (sintering), and then cutting it to the desired size. The surface of the substrate that was in contact with the mylar film during the curing process is very smooth, and the surface that had been exposed is only slightly rougher.

In attempting to metallize a wafer of the aforedescribed beryllia, it was noted that greater adhesion occurred on the rougher surface, although the bond was unsatisfactory for enabling a reliable soldered connection to be made to the metallized film. Inasmuch as beryllia is an oxide and as such will not establish a surface-to-surface bond with a metal by a chemical process, any adhesion of the metal to the substrate is apparently due to a roughened surface profile of the substrate.

SUMMARY OF THE INVENTION

This invention provides a method of preparing a beryllia substrate for direct autocatalytic deposition of a metallized film on the substrate.

In accordance with this invention, a beryllia substrate is prepared for metallization by direct autocatalytic deposition by establishing roughened surfaces on the substrate prior to the plating process. The roughened surfaces are preferably obtained through chemical etching processes. In one preferred embodiment, a beryllia substrate is immersed in an alkali metal salt solution in which beryllia is soluble for establishing a uniform surface profile over the entire substrate, then is rinsed with water and then is immersed in a fluoride-based acid solution for removing glass alloying constituents from the grain boundaries of the substrate preparatory to submitting the substrate to a conventional autocatalytic metallization plating process.

DESCRIPTION OF THE PREFERRED EMBODIMENT

A beryllia substrate utilized in carrying out the invention may be manufactured according to the aforedescribed method, yielding a surface roughness of 8–10 micro inches on one side and 18–20 micro inches on the opposite side. The substrate also contains glass alloying constituents such as silica and magnesium but preferably has a high beryllia content on the order of 99.5% beryllia (beryllium oxide). Prior to introducing the substrate to the sequential etching solutions of this invention, the substrate is cleaned in suitable degreasing and cleaning solvents.

Following the cleaning operation the substrate is immersed in a first, or pre-etch, alkali metal salt solution in which the beryllia is soluble to produce approximately the same degree of surface roughness or surface profile over the entire substrate. Etches of this type are known in the art of plating beryllium copper where beryllia exists in an amount approximately 1% by weight in copper as an alloy. The beryllia itself is not platable and the surface beryllia is etched away from the copper alloy preparatory to plating. An aqueous solution which is 50% by weight sodium hydroxide and heated to approximately 250° C. is known for the beryllium copper plating methods and is utilized as the first, or pre-etch solution in this invention. The substrate is maintained immersed in this solution for 7–20 minutes.

The roughened beryllia substrate is then removed from the pre-etch and is rinsed with clear water. Following the rinse, the substrate is immersed in a second etch solution which is specific to glass, i.e. the glass alloying constituents silica and magnesium are soluble therein. This etch is a fluoride-based solution, preferably fluoroboric acid which is 30% volume to volume at room temperature, or about 20° to 30° C. The substrate is maintained in this solution for 5 to 20 minutes to remove the silica and magnesium from the surface grain boundaries of the beryllia, thereby providing sharply defined crevices between the beryllia grains into which a metallization film can adhere.

At this point the beryllia substrate is suitably prepared for metallization by an autocatalytic deposition process. By way of example, a metallization of nickel may be applied by a conventional plating for nonconductors method. Specifically, the beryllia substrate is removed from the last mentioned etch, submitted to a water rinse and is immersed for 5 minutes in a 5 gram per liter stannous chloride solution at 3 Normal (with respect to hydrochloric acid) followed by a water rinse, followed by a dip in 0.1 gram per liter of palladium chloride at a pH of 1 to 5 minutes, a water rinse and electroless nickel plating in either a nickel boron bath or a nickel-phosphorous bath as is known in the art of electroless or autocatalytic nickel plating.

Test results have demonstrated that objects soldered to a beryllia substrate plated in accordance with this invention have withstood applications of 240 to 250 pounds per square inch shear strength forces, and that forces pulling away from the substrate at a 90° angle have caused the beryllia substrate to break, but not the soldered joint. Conversely, an attempt to directly plate nickel to a beryllia substrate which was not prepared in accordance with this invention failed to maintain a bond between the substrate and plating when a piece of common cellophane tape was applied to the plating and subsequently pulled away.

What is claimed is:

1. A method of preparing a beryllia substrate for a subsequent autocatalytic deposition of a metallized film directly thereon comprising chemically etching the substrate to roughen the surfaces thereof,
said chemical etching comprising the steps of exposing said substrate to a solution in which beryllia is soluble for establishing a uniform surface profile for the substrate, then rinsing the substrate with a neutral solution, and then exposing the substrate to a solution in which other constituents of the substrate are soluble to remove said other constituents from the grain boundaries of the beryllia at the surface of the substrate.

2. A method of preparing a beryllia substrate for a subsequent autocatalytic deposition of a metallized film directly thereon comprising, in order:
immersing said substrate in an alkali metal salt solution;
rinsing said substrate with a neutral solution; and
immersing said substrate in a fluoride-based solution.

3. The method of claim 2 further comprising the additional steps of rinsing said substrate with a neutral solution followed by autocatalytic plating a metallized film directly on said substrate.

4. The method of claim 3 wherein said alkali metal salt solution is a sodium hydroxide solution.

5. The method of claim 4 wherein said sodium hydroxide solution is an aqueous solution 50% by weight sodium hydroxide.

6. The method of claim 4 wherein the temperature of said sodium hydroxide solution is about 250° C.

7. The method of claim 3 wherein the temperature of said fluoride-based solution is about 25° C.

8. The method of claim 3 wherein said fluoride-based solution is a fluorboric acid solution.

9. The method of claim 8 wherein said fluorboric acid solution is an aqueous solution 30% volume to volume fluorboric acid.

10. The method of claim 3 wherein said fluoride-based solution is a hydrofluoric acid solution.

11. The method of claim 10 wherein said hydrofluoric acid solution is an aqueous solution 30% volume to volume hydrofluoric acid.

12. The method of claim 6 wherein said substrate is immersed in said sodium hydroxide solution for 7 to 20 minutes.

13. The method of claim 7 wherein said substrate is immersed in said fluroide-based solution for 5 to 20 minutes.

14. The method of claim 3 wherein said neutral solution rinses are a clear water rinses.

* * * * *